United States Patent
Yao et al.

(10) Patent No.: US 7,057,299 B2
(45) Date of Patent: Jun. 6, 2006

(54) ALIGNMENT MARK CONFIGURATION

(75) Inventors: Liang-Gi Yao, Taipei (TW); Jaw-Jung Shin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/817,682

(22) Filed: Mar. 26, 2001

(65) Prior Publication Data

US 2001/0033033 A1    Oct. 25, 2001

Related U.S. Application Data

(63) Continuation-in-part of application No. 09/521,021, filed on Mar. 8, 2000, now abandoned.

(30) Foreign Application Priority Data

Feb. 3, 2000 (TW) ................................ 89101950

(51) Int. Cl.
*H01L 23/544* (2006.01)
(52) U.S. Cl. ..................................... 257/797
(58) Field of Classification Search ............... 257/797; 438/401, 462
See application file for complete search history.

(56) References Cited

U.S. PATENT DOCUMENTS

| | | | | |
|---|---|---|---|---|
| 5,316,966 A | * | 5/1994 | Van Der Plas et al. | 148/DIG. 102 |
| 5,668,042 A | * | 9/1997 | Bae | 148/DIG. 106 |
| 5,733,801 A | * | 3/1998 | Gojohbori | 438/401 |
| 5,893,744 A | * | 4/1999 | Wang | 438/401 |
| 5,949,145 A | * | 9/1999 | Komuro | 257/797 |
| 6,015,744 A | * | 1/2000 | Tseng | 438/401 |
| 6,037,671 A | * | 3/2000 | Kepler et al. | 257/622 |
| 6,043,133 A | * | 3/2000 | Jang et al. | 438/401 |
| 6,100,158 A | * | 8/2000 | Lee et al. | 438/401 |
| 6,181,018 B1 | * | 1/2001 | Saino | 257/797 |
| 6,191,000 B1 | * | 2/2001 | Huang et al. | 438/424 |
| 6,215,197 B1 | * | 4/2001 | Iwamatsu | 257/797 |
| 6,285,455 B1 | * | 9/2001 | Shiraishi | 356/486 |
| 6,326,309 B1 | * | 12/2001 | Hatanaka et al. | 438/693 |
| 6,342,735 B1 | * | 1/2002 | Colelli et al. | 257/797 |
| 6,344,698 B1 | * | 2/2002 | Barr et al. | 257/797 |
| 6,391,737 B1 | * | 5/2002 | Ku et al. | 438/401 |
| 6,440,816 B1 | * | 8/2002 | Farrow et al. | 438/401 |
| 6,545,336 B1 | * | 4/2003 | Kobayashi et al. | 257/499 |

* cited by examiner

*Primary Examiner*—Eugene Lee
(74) *Attorney, Agent, or Firm*—J.C. Patents

(57) ABSTRACT

An alignment mark configuration, wherein the alignment mark is protected from being damaged from the subsequent planarization process, is described. The alignment mark configuration comprises a plurality of recesses and a flat spacing between the recesses on the substrate. If the substrate further comprises a trench structure, the spacing between the trench structure and the alignment mark is at least 5 times the flat spacing between the neighboring recesses of the alignment mark.

6 Claims, 1 Drawing Sheet

ALIGNMENT MARK CONFIGURATION

CROSS-REFERENCE TO RELATED APPLICATION

This application is a continuation-in-part application of, and claims the priority benefit of, U.S. application Ser. No. 09/521,021, filed on Mar. 8, 2000 now abandoned and entitled "Alignment Mark Configuration".

BACKGROUND OF THE INVENTION

1. Field of the Invention

The present invention relates to an integrated device. More particularly, the present invention relates to an alignment mark configuration.

2. Description of the Related Art

Photolithography is a critical step in the fabrication of an integrated device. For any general type of device fabrication, depending on the complexity of the product, the number of photolithography processes that are required to complete the product vary in number from about 10 to 18. In order to properly transfer a pattern on a mask to the wafer, the location of the alignment mark must be identified to accurately register the pattern on the mask with the previously formed pattern before performing the exposure process. The issue of discarding the entire wafer due to a mistake such as pattern misalignment in the pattern transferring process is thus prevented.

Proper identification of the alignment mark location mainly relies on the topography of the wafer surface. A scattering site or diffraction edge of an incident light is formed during the alignment process. The diffraction light reflected from the alignment mark is used as a signal, which is received by the overlay detector, to align the wafer and the mask.

The alignment mark is usually located on the scribe line and is formed concurrently with the shallow trench isolation structure. Since the last step in shallow trench formation is chemical mechanical polishing, damage may be inflicted upon the alignment mark to various extents due to the influence of the topography surrounding the alignment mark. If the damage inflicted on the alignment marks is too serious, the overlay detector cannot detect a clear alignment signal, causing a misalignment.

In general, the scribe line, depending on its orientation, is differentiated into the X-direction and the Y-direction. Surrounding the alignment mark in the Y-direction is usually a large flat region, whereas surrounding the alignment mark in the X-direction is often a large region of the trench structure. When a stepper and a KLA overlay machine are used to detect the extent of alignment between an upper layer and a lower layer, the overlay misalignment values detected in the X-direction and in the Y-direction are selectively presented in Table 1.

TABLE 1

| Stepper | | KLA Overlay Machine | |
| --- | --- | --- | --- |
| X(3 sigma) | Y(3 sigma) | X max | Y max |
| 1.526 | 0.014 | 0.707 | 0.044 |
| 1.572 | 0.018 | 1.330 | 0.105 |
| 1.392 | 0.015 | 1.085 | 0.050 |
| 0.842 | 0.024 | 0.744 | 0.051 |

Based on Table 1, the extent of misalignment using the alignment mark in the X-direction for alignment is significantly greater than when using the alignment mark in the Y-direction.

SUMMARY OF THE INVENTION

Based on the foregoing, the present invention provides an alignment mark configuration, wherein damage to the alignment mark due to chemical mechanical polishing is prevented. A sharp diffraction pattern of the alignment mark thereby results to allow the overlay detector to receive a clear alignment mark signal and to increase alignment accuracy. The overlay accuracy between upper and lower patterns is thus increased.

According to one preferred embodiment of the present invention, the alignment mark on the substrate comprises a plurality of recesses. If any type of trench, for example, shallow trench isolation, is also being formed on the substrate, the spacing between the trench and the alignment mark must be at least five times the spacing between the recesses.

As a result, subsequent to the planarization of the insulation layer by means of chemical mechanical polishing after the formation of the trench, damage to the alignment mark is prevented as a simple result of the topographical relationship between the trench and the alignment mark.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1:
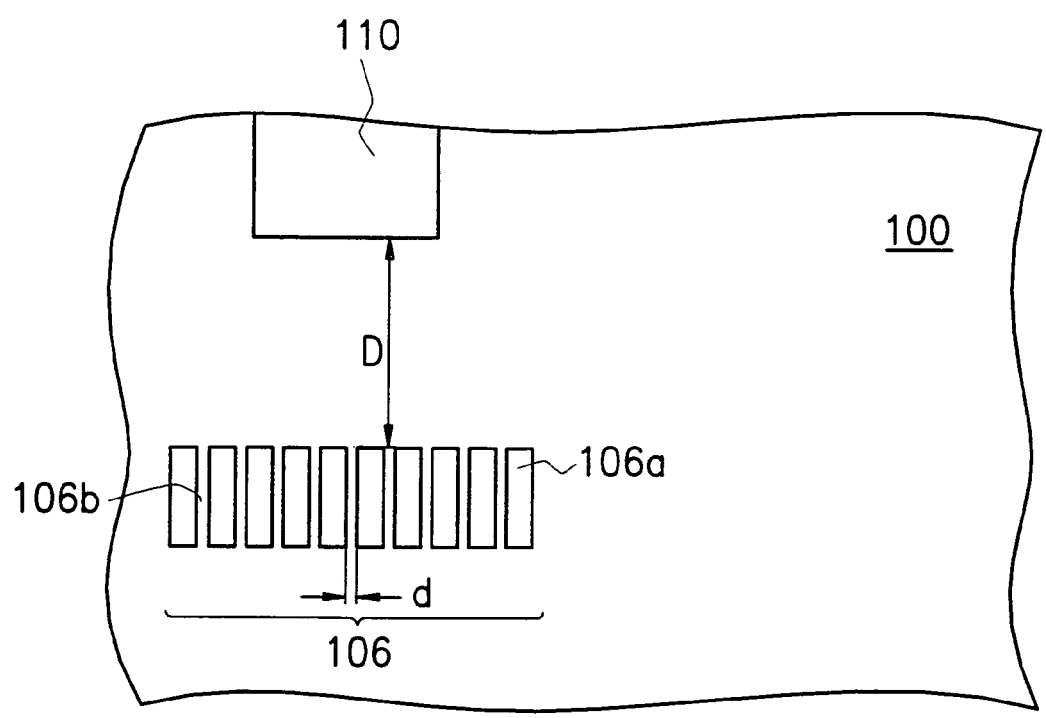
FIG. 1 is a schematic, top view illustrating the alignment mark configuration according to a preferred embodiment of the present invention.

Referring to the Table, irrespective of whether the stepper or the KLA machine is used in detecting the overlay results, the overlay misalignment values in the Y direction approach zero. On the other hand, the overlay misalignment values in the X direction are significantly higher than the overlay misalignment values in the Y direction.

Based on the above overlay misalignment testing result, one can deduce that when a trench is formed on the substrate, the spacing between the trench and the alignment mark cannot be too close so as to prevent any damage to the alignment mark during the chemical mechanical polishing process.

FIG. 1 is a schematic, top view illustrating the alignment mark configuration according to a preferred embodiment of the present invention. Referring to FIG. 1, the alignment mark 106 on a substrate 100 is formed by a plurality of recesses 106a and a flat spacing 106b between the recesses. The recesses 106a of the alignment mark 106 can be, for example, a plurality of trenches formed according to the fabrication process for a shallow trench isolation structure.

The width of each recess 106a is about 2 microns to about 6 microns and the width of the flat spacing 106b between the recesses 106a is denoted as "d", wherein "d" is about 6 microns to 12 microns.

The substrate 100 also comprises a trench 110, wherein the spacing between the trench 110 and the alignment mark 106 is denoted as "D". The spacing "D" is at least five times the flat spacing 106b "d" between the recesses 106a. Substrate 100 comprises a plurality of layers.

When "D" is at least 5 times "d", the upper sidewall of the recesses 106a of the alignment mark 106 is prevented from being damaged during the step of global planarization by means of chemical mechanical polishing. The scattering of the incident light due to the damage induced to the upper sidewall of the recesses 106a is thereby prevented. As a result, the alignment mark can provide a clear alignment signal to the overlay detector to increase the alignment accuracy.

Accordingly, the present invention provides an alignment mark configuration, wherein the problem relating to damage inflicted upon the alignment mark due to chemical mechanical polishing is prevented. As a result, the diffraction pattern of the alignment mark is sharper to provide a clear alignment signal to the overlay detector. The alignment accuracy is thus greatly increased.

Therefore, regardless of the type of the trench being formed on the substrate, the distance between the trench and the alignment mark is at least 5 times the flat spacing between the neighboring recesses. As a result, when the substrate is pressed against the flexible polishing pad on the polishing table, the polishing pad can maintain flatness in the neighborhood of the alignment mark. Damage, resulting from the polishing process, to the upper part of the sidewall of the recesses of the alignment mark is thus prevented.

According to the present invention, damage to the alignment mark is prevented. A clear alignment signal thus results to provide a good overlay result and to increase the yield of the product.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An alignment mark configuration, which is applicable on a substrate, the alignment mark configuration comprising:
    an alignment mark on the substrate, wherein the alignment mark comprises a plurality of recesses and a spacing between the neighboring recesses is "d", wherein the recess has a width of about 2 microns to about 6 and the spacing "d" is a range of about 6 microns to about 12 microns; and
    a trench not belonging to the alignment mark, wherein a spacing between the trench and the alignment mark is of a range between about 5d to 80d.

2. The alignment mark configuration according to claim 1, wherein the recesses include a plurality of trenches formed by a shallow trench isolation fabrication process.

3. The alignment mark configuration according to claim 1, wherein the trench includes a shallow trench isolation structure.

4. The alignment mark configuration according to claim 1, wherein each of the recesses is rectangular-like.

5. The alignment mark configuration according to claim 1, wherein each of the recesses is rectangular-like and is arranged in one direction side by side at long sides of the rectangular-like recesses.

6. An alignment mark configuration, which is applicable on a substrate, the alignment mark configuration comprising:
    an alignment mark on the substrate, wherein the alignment mark comprises a plurality of recesses, wherein each of the recesses is rectangular-like and a spacing between the neighboring recesses is "d"; and
    a trench not belonging to the alignment mark, wherein a spacing between the trench and the alignment mark is of a range between about 5d to about 80d.

* * * * *